United States Patent
Liaw

(10) Patent No.: US 7,112,857 B2
(45) Date of Patent: Sep. 26, 2006

(54) DEVICES WITH DIFFERENT ELECTRICAL GATE DIELECTRIC THICKNESSES BUT WITH SUBSTANTIALLY SIMILAR PHYSICAL CONFIGURATIONS

(75) Inventor: Jhon Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 3 days.

(21) Appl. No.: 10/886,215

(22) Filed: Jul. 6, 2004

(65) Prior Publication Data

US 2006/0006440 A1    Jan. 12, 2006

(51) Int. Cl.
*H01L 29/78*    (2006.01)

(52) U.S. Cl. ............... 257/392; 257/296; 257/412; 257/903

(58) Field of Classification Search ............ 257/296, 257/392, 412, 903
See application file for complete search history.

(56) References Cited

U.S. PATENT DOCUMENTS

| | | | | |
|---|---|---|---|---|
| 5,637,903 A | * | 6/1997 | Liao et al. | 257/412 |
| 5,703,392 A | * | 12/1997 | Guo | 257/392 |
| 6,100,568 A | * | 8/2000 | Lage | 257/392 |
| 6,348,719 B1 | * | 2/2002 | Chapman | 257/412 |
| 6,492,690 B1 | * | 12/2002 | Ueno et al. | 257/392 |
| 6,528,897 B1 | * | 3/2003 | Kuwazawa | 257/204 |

\* cited by examiner

*Primary Examiner*—Gene M. Munson
(74) *Attorney, Agent, or Firm*—Duane Morris LLP

(57) ABSTRACT

An integrated circuit is disclosed having one or more devices having substantially similar physical gate electric thicknesses but different electrical gate electric thicknesses for accommodating various operation needs. One or more devices are manufactured with a same mask set using multiple doping processes to generate substantially similar physical gate dielectric thicknesses, but with different electrical gate dielectric thicknesses. The device undergoing multiple doping processes have different dopant concentrations, thereby providing different electrical characteristics such as the threshold voltages.

7 Claims, 4 Drawing Sheets

DEVICES WITH DIFFERENT ELECTRICAL GATE DIELECTRIC THICKNESSES BUT WITH SUBSTANTIALLY SIMILAR PHYSICAL CONFIGURATIONS

BACKGROUND

The present invention generally relates to integrated circuits (IC), and more particularly to logic and memory ICs that utilize a multi-stage doping methodology to electrically adjust characteristics of a metal-oxide-semiconductor field effect transistor (MOSFET) and for reducing the size of the same.

As MOSFETs continuously downscale, the thermal budget, source/drain junction depth and dopant concentration are reduced for alleviating short channel effects. However, there is a limit to this trend of reduction. If the limit is exceeded, the lower poly gate doping profile can change, which may induce an undesirable depletion region between the gate electrode and the gate dielectric layer. If the gate dopant concentration does not saturate enough, it will increase the electrical gate dielectric thickness and degrade the MOSFET saturation current. The electrical gate dielectric thickness is the equivalent thickness of the gate dielectric layer under certain electrical conditions. Two MOSFETs with the same physical gate dielectric thickness may have different electrical gate dielectric thickness. For example, those two MOSFETs operating under different electrical conditions, e.g., with different gate dopant concentrations, can have significantly unmatched electrical gate dielectric thickness. In general, one of the MOSFETs may have a "thinner" electrical gate dielectric thickness than the other if it has a greater gate dopant concentration. As such, an insufficiently doped gate electrode usually results in an undesirably thick electrical gate dielectric thickness.

Conventionally, only a single-stage doping is performed for the gate structures of logic devices and memory cells in fabrication of an IC, such as SRAM and DRAM. For example, in an SRAM cell design, a pass gate device usually requires a narrower channel width and a longer channel length than a pull-down device, in order to obtain a high β ratio and static noise margin (SNM). However, such design will cause an inverse narrow width effect and decrease the β ratio in a low voltage operation. The long channel length design particularly causes the size of the memory cell to increase. An optimal design for an SRAM circuit should have a pass gate device with a higher threshold voltage and lower saturation current when compared to a pull-down device. As such, the electrical characteristics of the pass gate device and the pull-down device should be different.

A DRAM cell often includes a pass gate device coupled with a capacitor. In a DRAM cell design, the pass gate device leakage and capacitor gate leakage are the ones of major concerns. A lower gate leakage and sub-threshold leakage are desirable for a better data retention, reliability, and standby leakage current specification. In order to achieve these objectives, a thicker gate dielectric layer is needed for the pass gate device than other peripheral logic devices. This disparate thickness of gate dielectric layers complicates the fabrication process.

Desirable in the art of logic and memory devices fabrication are new MOSFETs with electrically adjusted gate structures that will result in minimal cell size while still meeting or exceeding the current electrical performance parameters.

SUMMARY

In view of the foregoing, an integrated circuit is disclosed having one or more devices having substantially similar physical gate dielectric thicknesses but different electrical gate dielectric thicknesses for accommodating various operation needs. One or more devices are manufactured with a same mask set using multiple doping processes to generate substantially similar physical gate dielectric thicknesses, but with different electrical gate dielectric thicknesses. The device undergoing multiple doping processes have different dopant concentrations, thereby providing different electrical characteristics such as the threshold voltages.

The construction and method of operation of the invention, however, together with additional objects and advantages thereof will be best understood from the following description of specific embodiments when read in connection with the accompanying drawings.

DESCRIPTION

Figure 1:
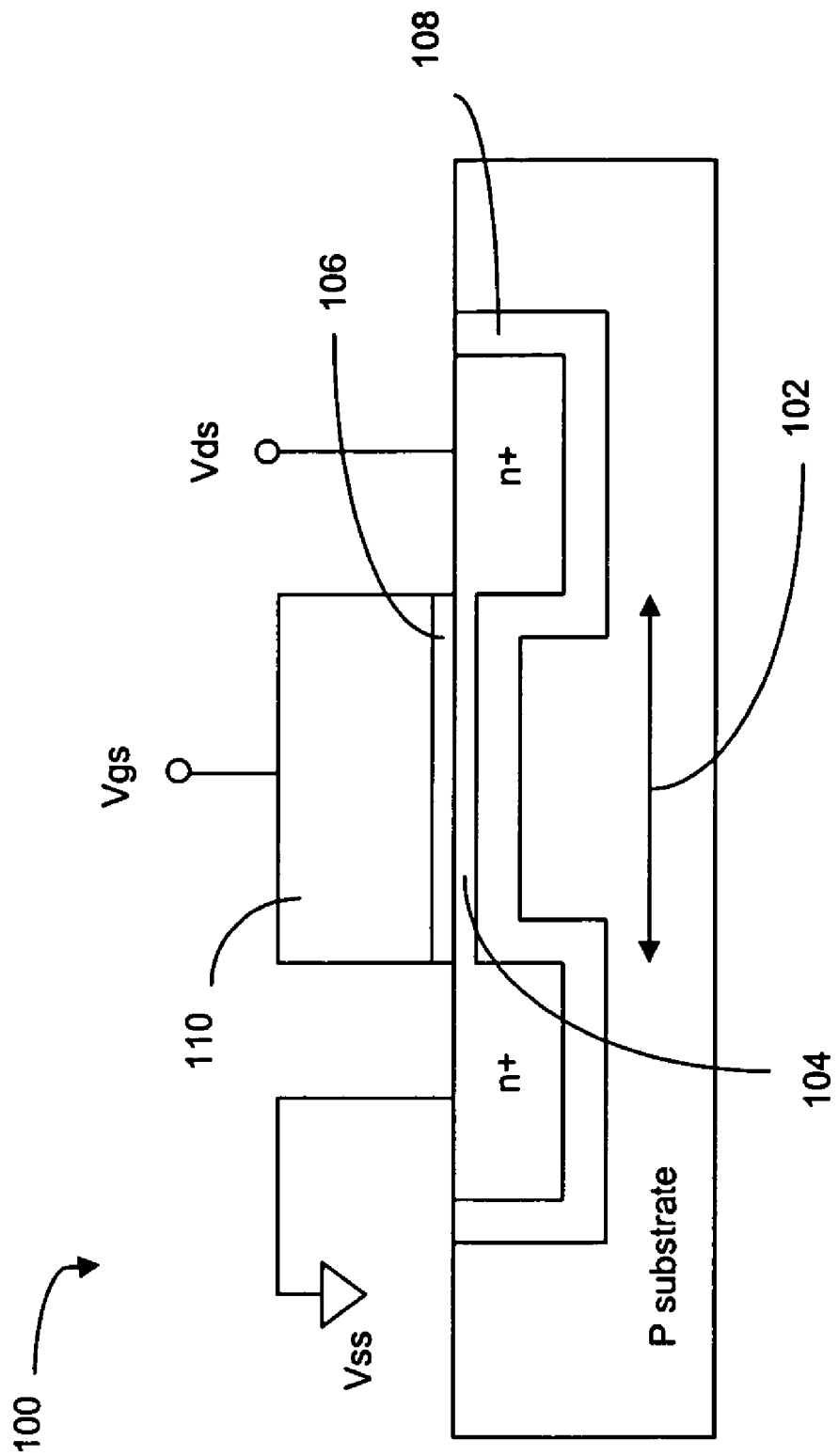
FIG. 1 illustrates a physical construction of a conventional MOSFET.

FIG. 1 illustrates the physical construction of a conventional N-type MOSFET 100. The MOSFET is constructed on a P substrate with n+ doped areas as the source and drain electrodes on either side of the substrate. The distance 102 between the n+ doped areas is often known as the channel length. The source and drain electrodes are identical and can be interchanged, depending on the application of voltages. Devices processed with advanced technologies may have a channel length less than 1 micron, and such devices may be referred to as sub-micron devices or nano-devices. In this example, the electron current flow will be generated by the electrode connected to Vss (source), and travel through the conducting channel 104 as determined by the gate voltage (Vgs) to the electrode connected to Vds (drain). If the gate voltage is zero, no electron current will flow from the source to the drain. The gate terminal is composed of a doped polysilicon electrode 110 connected to Vgs, which is separated from the conducting channel 104 by a gate dielectric layer 106. This separation forms a parasitic capacitance between the gate electrode 110 and the conducting channel 104. A capacitance is also formed between the conducting channel 104 and the P substrate due to a depletion region 108 that is formed during the IC fabrication.

Figure 2:
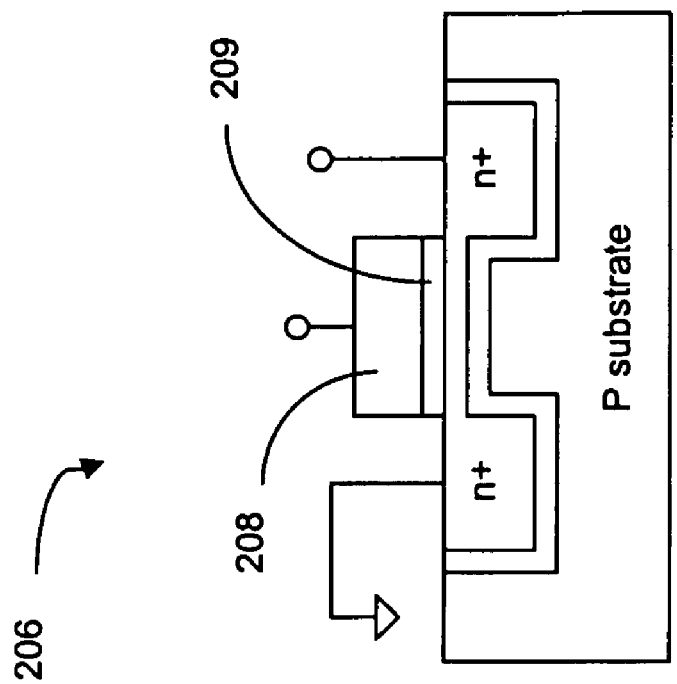
FIG. 2 illustrates physical constructions of two NMOS devices, wherein one device uses a one-stage doping gate structure and the other uses a two-stage doping gate structure in accordance with one embodiment of the present invention.
Figure 2:
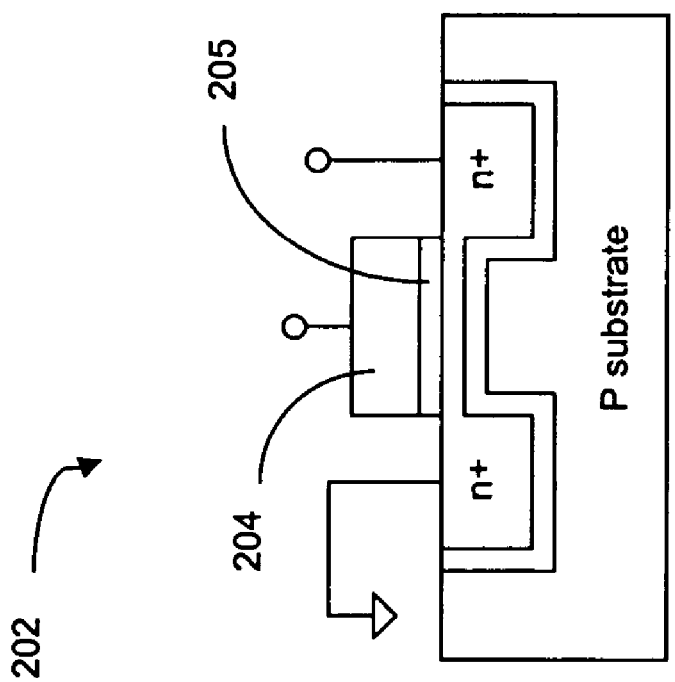

FIG. 2 illustrates an integrated circuit module having at least two devices whose gate structures are electrically adjusted to achieve various electric characteristics, according to one embodiment of the present invention. The NMOS transistors 202 and 206 are used as an example for explaining the embodiment. The NMOS transistor 202 utilizes a single-stage gate doping method to form a lightly doped first gate electrode 204 atop a first gate dielectric layer 205. The NMOS transistor 206 utilizes the proposed two-stage gate doping method to form a heavily doped second gate electrode 208 atop a second gate dielectric layer 209.

The construction of NMOS transistors 202 and 206 are identical except for their gate dopant concentrations. While the physical thicknesses of the first and second gate dielectric layers 205 and 209 are approximately the same, the gate dopant concentrations for the gate electrodes 204 and 208 are substantially different. The first gate electrode 204 has a first gate dopant concentration that is approximately 50% lower than a second gate dopant concentration of the second gate electrode 208. Typically, the physical gate dielectric thicknesses of the first and second gate dielectric layers 205 and 209 are less than about 20 Angstroms. However, the electrical performance of the first and second dielectric layers 205 and 209 are substantially different that results in at least an equivalent difference of a 2 Angstroms in the physical thickness due to the different dopant concentrations. In some cases, it can be more than 5 Angstroms in difference. It is understood that for the purpose of this invention, the electrical gate dielectric thickness is measured in terms of physical thickness.

In an IC that uses only the one-stage doping method, all MOSFETs within that IC will have the same gate dopant concentrations. In an IC that uses the proposed two-stage doping method, its MOSFETs would have different gate dopant concentrations as determined by operation needs for optimal IC device performance and reduced device size.

The two-stage gate doping methodology utilizes basically the same masks and same process steps as the conventional SRAM/DRAM. However, the two-stage gate doping utilizes an additional gate doping process for increasing the dopant concentration on selected devices. For example, a gate dielectric layer is first formed on a conducting channel between the source and drain by a chemical vapor deposition (CVD) process. A polysilicon layer is then formed atop the gate dielectric layer by a process, such as CVD and sputtering. This polysilicon layer is doped with N-type impurities for improving its conductivity. Thereafter, a second-stage doping is performed on selected devices. The second-stage doping results in a higher dopant concentration in the gate structures than those doped in the one-stage process. In NMOS transistors as shown in FIG. 2, an N-type impurity, such as As, P31 and Sb, is used in the first-stage doping and the second stage doping. After the two-stage doping, subsequent fabrication processes are performed to complete both the one-stage and the two-stage doped transistors.

Figure 3:
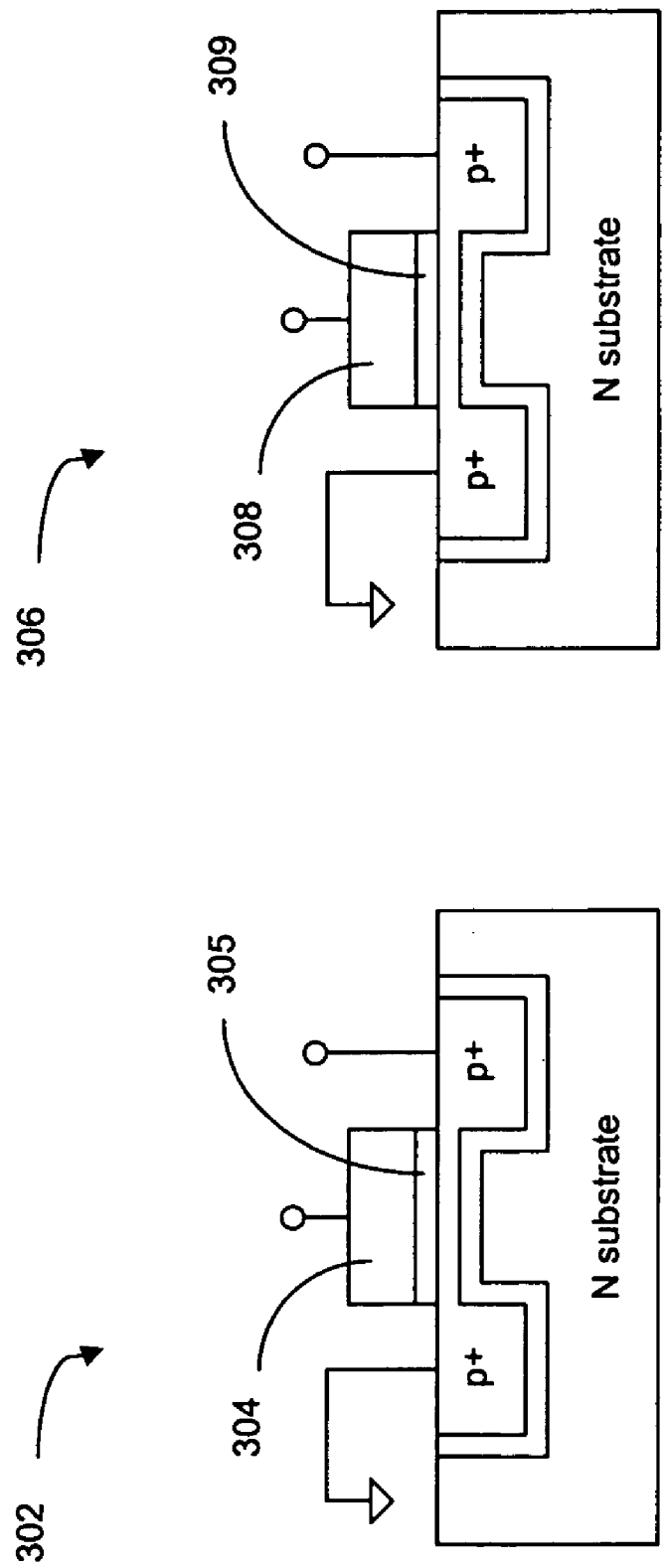
FIG. 3 illustrates physical constructions of two PMOS devices, wherein one device uses a one-stage doping gate structure and the other uses a two-stage doping gate structure in accordance with one embodiment of the present invention.

FIG. 3 presents a cross-sectional view of two identical PMOS transistors 302 and 306 except for their gate doping concentrations. A PMOS transistor 302 utilizes the conventional one-stage gate doping method to form a lightly doped first gate electrode 304, while a PMOS transistor 306 utilizes the proposed two-stage gate doping method to form a heavily doped second gate electrode 308. In PMOS transistors as shown in FIG. 3, a P-type impurity, such as B11, BF2, and In, is used in the first-stage doping and the second stage doping. It is noteworthy that the constructions of both transistors are identical except for their gate dopant concentrations. Like NMOS transistors 202 and 206 in FIG. 2, the physical thicknesses of the first gate dielectric layer 305 and the second gate dielectric layer 309 are less than about 20 Angstroms. However, the performance of the first and second gate dielectric layers 305 and 309 are so different that results in at least an equivalent 2-Angstrom performance difference in terms of their electrical gate dielectric thicknesses.

As an another embodiment of this invention, more than two stage dopings may be implemented to create multiple gate dopant concentrations in devices, such as memory cells and logic devices. This would electrically adjust device characteristics to accommodate various operation needs. After the first and second gate doping processes are completed, more rounds of gate doping processes are performed on selected devices within an IC in order to form even more heavily doped gate structures.

This invention has an advantage of creating two devices with two different electrical gate dielectric thicknesses without altering the physical gate dielectric thickness. Thus, no additional mask is required to form a dielectric layer with different thicknesses in various areas. The lightly doped gate electrode has a higher threshold voltage, while the heavily doped gate electrode has a lower threshold voltage. By selecting devices for the different dopant concentrations, they may accommodate various operational needs. For example, a memory cell, such as an SRAM cell and a DRAM cell, often have devices requiring various threshold voltages.

Figure 4:
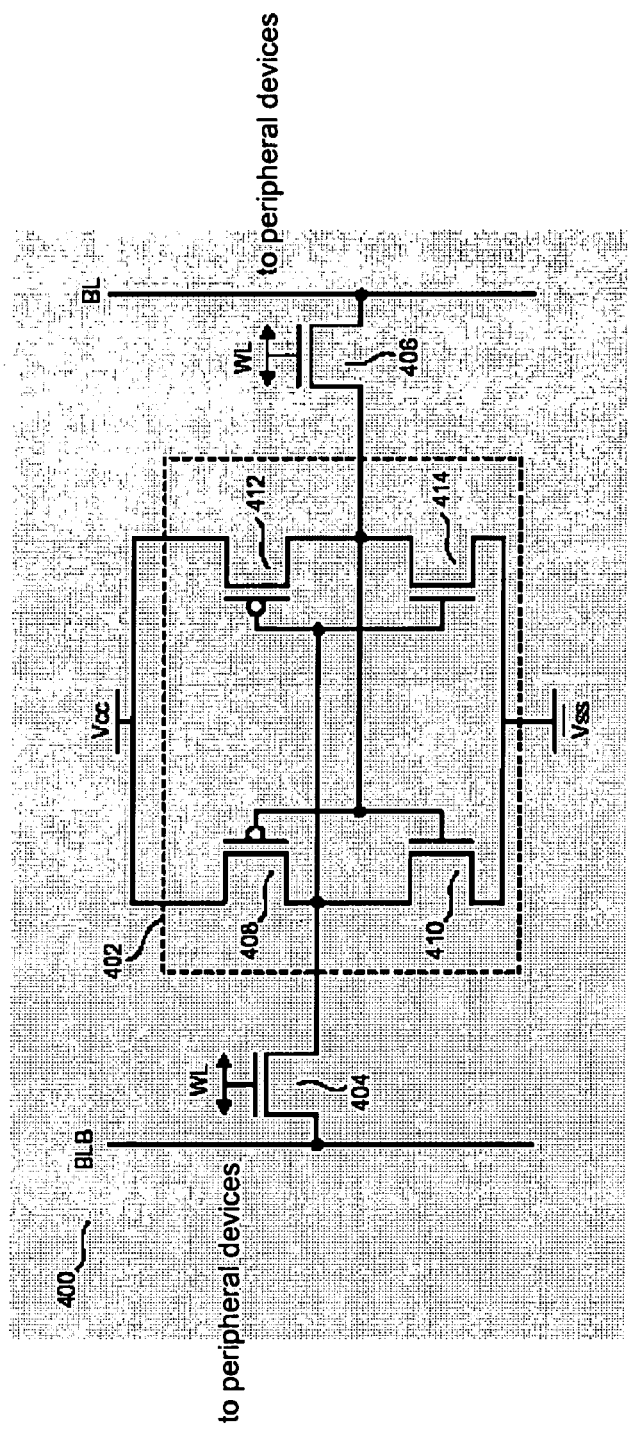
FIG. 4 presents a schematic of a typical SRAM cell using the proposed gate structure according to one embodiment of the present invention.

FIG. 4 presents an example that this invention is applied in a six-transistor SRAM cell 400 that incorporates both the one-stage doped devices and the proposed two-stage doped devices. The SRAM cell 400 contains a cross-coupled inverter 402 and two pass gate devices 404 and 406. It is understood that there are additional peripheral logic devices within the IC (not shown in this figure) that interface with, and control over the pass gate devices 404 and 406 for data read/write functions of the SRAM cell 400. The cross-coupled inverter 402 is comprised of two inverter circuits. One inverter includes a pull-up PMOS transistor 408, and pull-down NMOS transistor 410, while the second inverter includes a pull-up PMOS transistor 412 and pull-down NMOS transistor 414. Unlike a DRAM cell, the SRAM cell 400 does not have to be periodically refreshed. The SRAM cell 400 retains data bits in its memory by the states of the two cross-coupled inverter 402 as long as power is applied to it. The NMOS pass gate devices 404 and 406 are turned on by the appropriate word line WL to allow the differential voltages on the bit lines BL and BLB to be read from or written to the SRAM cell 400, as determined by the peripheral logic devices that control the bit lines BL and BLB.

The present two-stage doped gate structure can be implemented on the SRAM cell 400 by applying the two-stage gate doping process on selected devices, while all other devices would utilize the one-stage gate doping process. In this embodiment, the pass gate devices 404, 406 and Pull-up PMOS transistors 408, 412 will remain as one-stage, lightly doped devices due to their low gate leakage requirements. The Pull-down NMOS transistors 410, 414, and other peripheral logic devices (not shown in this figure) such as decoder circuits, NAND devices, NOR devices, inverter devices, selector circuits, sense amplifier circuits, etc., as well as other high performance devices (not shown in this figure) such as decoder circuits, NAND devices, NOR devices, inverter devices, would incorporate the two-stage doping process for reducing their gate channel length, and therefore, the device physical size. Typically the thicknesses of the gate dielectric layers for the pass gate devices 404, 406, Pull-up PMOS transistors 408, 412, Pull-down NMOS transistors 410, 414 and peripheral logic devices are less than 15 Angstroms. The physical gate dielectric thickness of all those devices are substantially the same, while the gate dopant concentration of the Pull-down NMOS transistors 410, 414 are substantially higher than the Pull-up PMOS transistors 408, 412 and the pass gate devices 404, 406. In addition, the gate dopant concentration of the peripheral logical devices and high performance devices are substantially greater than the Pull-down NMOS transistors 410, 414. The higher gate dopant concentration is about 50% greater than the lower gate dopant concentration. This results in the Pull-down NMOS transistors 410, 414 having electrical gate dielectric thicknesses substantially thinner than the pull-up PMOS transistors 408, 412 and the pass gate device 404, 406. The peripheral logic devices and high performance devices have electrical gate dielectric thicknesses substantially thinner than the pull-down NMOS transistors 410, 414.

The two-stage gate doping process would reduce the electrical gate dielectric thickness of these heavily doped devices, while leaving the pass gate devices 404, 406 and pull-up PMOS transistors 408 and 412 to be manufactured using the one-stage doping method on these devices. The advantage of using the two-stage gate doping process on the pull-down NMOS transistors and peripheral logic devices would result in a higher β ratio, a higher SNM at lower operational voltages, a higher threshold voltage, and most importantly, a smaller device physical size. These advantages are gained without additional masks or costs that would have incurred if a gate dielectric layer with various thicknesses are implemented.

Figure 5:
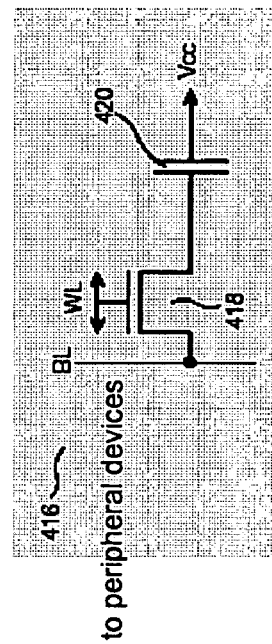
FIG. 5 presents a schematic of a typical DRAM cell using the proposed gate structure according to one embodiment of the present invention.

FIG. 5 presents a typical DRAM memory circuit 416 as another example of this invention which incorporates both the conventional one-stage and the proposed two-stage gate doping method within an IC. The simplified DRAM memory circuit 416 includes a pass gate device 418, a bit storage capacitor 420, and the peripheral logic devices (not shown). The capacitor 420 acts as the memory storage device by maintaining a charge (data value "1") or no charge (data value "0"). The capacitor is typically a MOSFET device whose source and drain are electrically connected together. The gate dielectric layer between the gate and the source drain connection acts as the capacitance. The pass gate device 418 allows for the read, write, or refresh of the capacitor 420 as controlled by the word line WL and the status of the bit line BL. In DRAM devices, it is essential that the pass gate device 418 and the capacitor 420 have low leakage to maximize the data retention time. Therefore, both the pass gate 418 and capacitor 420 should utilize the one-stage lightly doped gate doping method. However, the peripheral logic devices (not shown) and the high performance devices (not shown) within the IC can utilize the two-stage method to reduce their physical size and still meet their electrical performance requirements. The relationship of the gate dopant concentration and electrical gate dielectric thickness are similar to that as discussed above. As the SRAM circuit 400, the embodiment of this invention, which utilizes a multiple-stage gate doping method for making DRAM devices, further reduces the device physical size without compromising on the performance.

It is noted that the present invention does not require any additional mask for implementing the additional doping process to form different gate dopant concentrations. In other words, multiple-dopant-concentration gate structures are created among different transistors on their interface between Si and gate dielectric layers. As such, the process effectively creates two or more classes of effective core gate dielectric thickness with no additional mask needed. As any additional masks can cost significantly for the manufacturing, the present invention provides an economical solution for fabrication. In addition, since the same mask set is used, the only additional process added for altering the electrical characteristics is the additional doping process(es), there is no additional cost for adding the extra doping steps to the regular manufacturing process flow. Furthermore, due to the different electrical thicknesses available by using different doping concentrations, pass gate device leakage or capacitor leakages are reduced. The beta ratio and static noise margin at lower operating voltage are improved.

The above invention provides many different embodiments or examples for implementing different features of the invention. Specific examples of components and processes are described to help clarify the invention. These are, of course, merely examples and are not intended to limit the invention from that described in the claims.

Although illustrative embodiments of the invention have been shown and described, other modifications, changes, and substitutions are intended in the foregoing invention. Accordingly, it is appropriate that the appended claims be construed broadly and in a manner consistent with the scope of the invention, as set forth in the following claims.

What is claimed is:

1. An static random access memory (SRAM) circuit comprising:
at least one pull-down NMOS transistor, having a first gate electrode with a first dopant concentration, formed atop a first gate dielectric layer with a first physical gate dielectric thickness;
at least one pull-up PMOS transistor, having a second electrode with a second dopant concentration, formed atop a second gate dielectric layer with a second physical gate dielectric thickness, wherein the pull-down NMOS transistor and the pull-up PMOS transistor are connected with each other for retaining data;
a pass gate device for enabling the pull-down NMOS transistor and the pull-up PMOS transistor to be electrically charged, the pass gate device having a third gate electrode with a third dopant concentration formed atop a third gate dielectric layer with a third physical gate dielectric thickness,
wherein the first physical gate dielectric thickness, the second physical gate dielectric thickness and the third physical gate dielectric thickness are substantially the same, the first dopant concentration is substantially greater than the second dopant concentration and the third dopant concentration by undergoing one or more additional doping processes to cause a difference of at least two angstroms in electrical gate dielectric thickness comparing to that of the pull-up PMOS transistor or the pass gate device.

2. The SRAM circuit of claim 1 wherein the pull-down NMOS transistor has a first electrical gate dielectric thickness substantially thinner than a second electrical gate dielectric thickness of the pull-up PMOS transistor and a third electrical gate dielectric thickness of the pass gate device.

3. The SRAM circuit of claim 1 wherein the first dopant concentration is at least 50% greater than the second dopant concentration and the third dopant concentration.

4. The SHAM circuit of claim 1 further comprising a peripheral logic device for operating with the pass gate device, wherein the peripheral logic device includes a fourth gate electrode having a fourth dopant concentration formed atop a fourth gate electric layer with a fourth physical gate dielectric thickness.

5. The SHAM circuit of claim 4 wherein while the fourth physical gate dielectric thickness is substantially the same as the first physical gate dielectric thickness, and the fourth dopant concentration is substantially greater than the first dopant concentration.

6. The SRAM circuit of claim 5 wherein the fourth dopant concentration is at least 50% greater than the first dopant concentration.

7. The SRAM circuit of claim 1 wherein the first physical gate dielectric thickness, the second physical gate dielectric thickness and the third physical gate dielectric thickness are less than 15 Angstroms.

* * * * *

UNITED STATES PATENT AND TRADEMARK OFFICE
CERTIFICATE OF CORRECTION

PATENT NO. : 7,112,857 B2  Page 1 of 1
APPLICATION NO. : 10/886215
DATED : September 26, 2006
INVENTOR(S) : Jhon Jhy Liaw It is certified that error appears in the above-identified patent and that said Letters Patent is hereby corrected as shown below:

Column 6, line 62, delete "SHAM" and insert therefore -- SRAM --.

Column 7, line 1, delete "SHAM" and insert therefore -- SRAM --.

Signed and Sealed this

Twentieth Day of November, 2007

JON W. DUDAS
*Director of the United States Patent and Trademark Office*